United States Patent
Park

(10) Patent No.: US 7,911,807 B2
(45) Date of Patent: Mar. 22, 2011

(54) DISPLAY DEVICE AND METHOD THEREOF

(75) Inventor: Ki-yong Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 655 days.

(21) Appl. No.: 11/930,708

(22) Filed: Oct. 31, 2007

(65) Prior Publication Data

US 2008/0137321 A1 Jun. 12, 2008

(30) Foreign Application Priority Data

Dec. 11, 2006 (KR) ........................ 10-2006-0125767

(51) Int. Cl.
*H05K 9/00* (2006.01)
(52) U.S. Cl. ..................... 361/818; 361/816; 361/799
(58) Field of Classification Search .................. 361/752, 361/730, 790, 797, 800, 807, 810, 816, 818, 361/700, 799, 681; 349/58–59; 174/35 R, 174/51, 251
See application file for complete search history.

(56) References Cited

U.S. PATENT DOCUMENTS

| 7,196,750 | B2 * | 3/2007 | Koo et al. ........................ 349/59 |
| 7,233,439 | B2 * | 6/2007 | Shimizu ........................ 359/456 |
| 7,372,700 | B2 * | 5/2008 | Jeong ............................ 361/704 |
| 7,457,120 | B2 * | 11/2008 | Bae et al. ...................... 361/704 |
| 7,468,582 | B2 * | 12/2008 | Kim et al. ..................... 313/582 |
| 7,535,174 | B2 * | 5/2009 | Shin .............................. 313/582 |
| 7,642,469 | B2 * | 1/2010 | Arakawa et al. .............. 174/381 |
| 2004/0217681 | A1 * | 11/2004 | Park et al. ..................... 313/110 |

FOREIGN PATENT DOCUMENTS

| JP | 2000315884 | 11/2000 |
| KR | 20-2000-0005799 | 4/2000 |
| KR | 1020060055107 A | 5/2006 |

* cited by examiner

*Primary Examiner* — Hung S Bui
(74) *Attorney, Agent, or Firm* — Cantor Colburn LLP

(57) ABSTRACT

A display device includes a panel assembly which forms an image, an accommodating member which accommodates the panel assembly, at least one printed circuit board ("PCB") installed on a back side of the accommodating member, and an electromagnetic wave shielding member disposed between the accommodating member and the PCB, and including a plurality of protrusions.

19 Claims, 11 Drawing Sheets

DISPLAY DEVICE AND METHOD THEREOF

This application claims priority to Korean Patent Application No. 2006-0125767, filed on Dec. 11, 2006, and all the benefits accruing therefrom under 35 U.S.C. §119, the contents of which in its entirety are herein incorporated by reference.

BACKGROUND OF THE INVENTION

1. Field of Invention

The present invention relate to a display device and a method thereof, and more particularly to a display device in which generation of electromagnetic interference ("EMI") is decreased, and a method of decreasing EMI in a display device.

2. Description of the Related Art

Among various types of display devices, a representative display device is one having a liquid crystal display ("LCD") panel which is small and light and still has more improved performance, compared to certain other display devices, based on a fast developing semiconductor technology.

Since the display device having the LCD panel has an advantage in lowering size, weight and electric power consumption, it has been drawing attention as a substitute for overcoming drawbacks of a conventional cathode ray tube ("CRT"). Today, the display device having the LCD panel is used in a midsize or large product such as a monitor, TV and other midsize or large products known in the art as well as in a small product such as a cellular phone, a personal digital assistant ("PDA"), a portable multimedia player ("PMP") and other small products known in the art. In short, the display device having the LCD panel is used in almost all information processing apparatuses that need a screen.

Since the LCD panel cannot emit light by itself, the display device having the LCD panel (also, shortly called "display device") has a backlight assembly including a light source unit which supplies the light to a backside of the LCD panel.

Also, the display device includes a printed circuit board ("PCB") for various uses. That is, the PCB includes a driving PCB which supplies a driving signal to the display panel, an inverter PCB which drives the light source unit, and other types of PCBs known in the art.

However, such various PCBs have a problem in that they generate the electromagnetic interference ("EMI"). The EMI generated by the PCBs causes deterioration in quality of the display device and other defects of the display device.

BRIEF SUMMARY OF THE INVENTION

Accordingly, it is an aspect of the present invention to provide a display device in which generation of electro-magnetic interference ("EMI") is decreased.

It is a further aspect of the present invention to provide a method for decreasing EMI in a display device.

Additional aspects of the present invention will be set forth in part in the description which follows and, in part, will be obvious from the description, or may be learned by practice of the present invention.

The foregoing and/or other aspects of the present invention can be achieved by providing a display device including a panel assembly which forms an image, an accommodating member which accommodates the panel assembly, at least one printed circuit board ("PCB") installed on a back side of the accommodating member, and an electromagnetic wave shielding member disposed between the accommodating member and the PCB, the electromagnetic wave shielding member including a plurality of protrusions.

The PCB may further include a driving PCB which supplies the panel assembly with a driving signal. The PCB may include a control circuit board which is connected with the driving PCB. The display device may further include a light source unit accommodated in the accommodating member and supplying the panel assembly with light, and the PCB may include an inverter circuit board which drives the light source unit.

The display device may further include a substrate cover combined with the accommodating member and covering the PCB, and may further include an additional electromagnetic wave shielding member disposed on a surface of the substrate cover that faces the PCB.

The plurality of protrusions may have a shape of a polygonal pyramid, a prism, a hemisphere, or an arch. Vertical sections of the plurality of the protrusions may have a shape of a depressed or bulging polygon. The plurality of protrusions may have an average width of about 0.1 μm to about 1000 μm.

The electromagnetic wave shielding member may include at least one of aloe, wood, aluminum, and synthetic resin.

The electromagnetic wave shielding member may be integrally formed with at least one of the accommodating member and the substrate cover.

The foregoing and/or other aspects of the present invention can also be achieved by providing a display device including a display panel, an accommodating member which accommodates the display panel, a PCB arranged on a surface of the accommodating member, and an electromagnetic wave shielding member disposed between the accommodating member and the PCB, the electromagnetic wave shielding member reflecting at least a portion of electromagnetic waves generated by the PCB.

The electromagnetic wave shielding member may include a plurality of protrusions protruding towards the PCB.

The foregoing and/or other aspects of the present invention can also be achieved by providing a method of decreasing generation of electromagnetic interference in a display device, the display device including a display panel disposed in an accommodating member and a PCB disposed on a rear surface of the accommodating member, the method including interposing an electromagnetic wave shielding member between the accommodating member and the PCB, the electromagnetic wave shielding member including a plurality of protrusions, wherein the electromagnetic wave shielding member reflects at least a portion of electromagnetic waves generated by the PCB.

BRIEF DESCRIPTION OF THE DRAWINGS

The above and/or other aspects, features, and advantages of the present invention will become apparent and more readily appreciated from the following description of the exemplary embodiments, taken in conjunction with the accompanying drawings, in which.

DETAILED DESCRIPTION OF THE INVENTION

Figure 1:
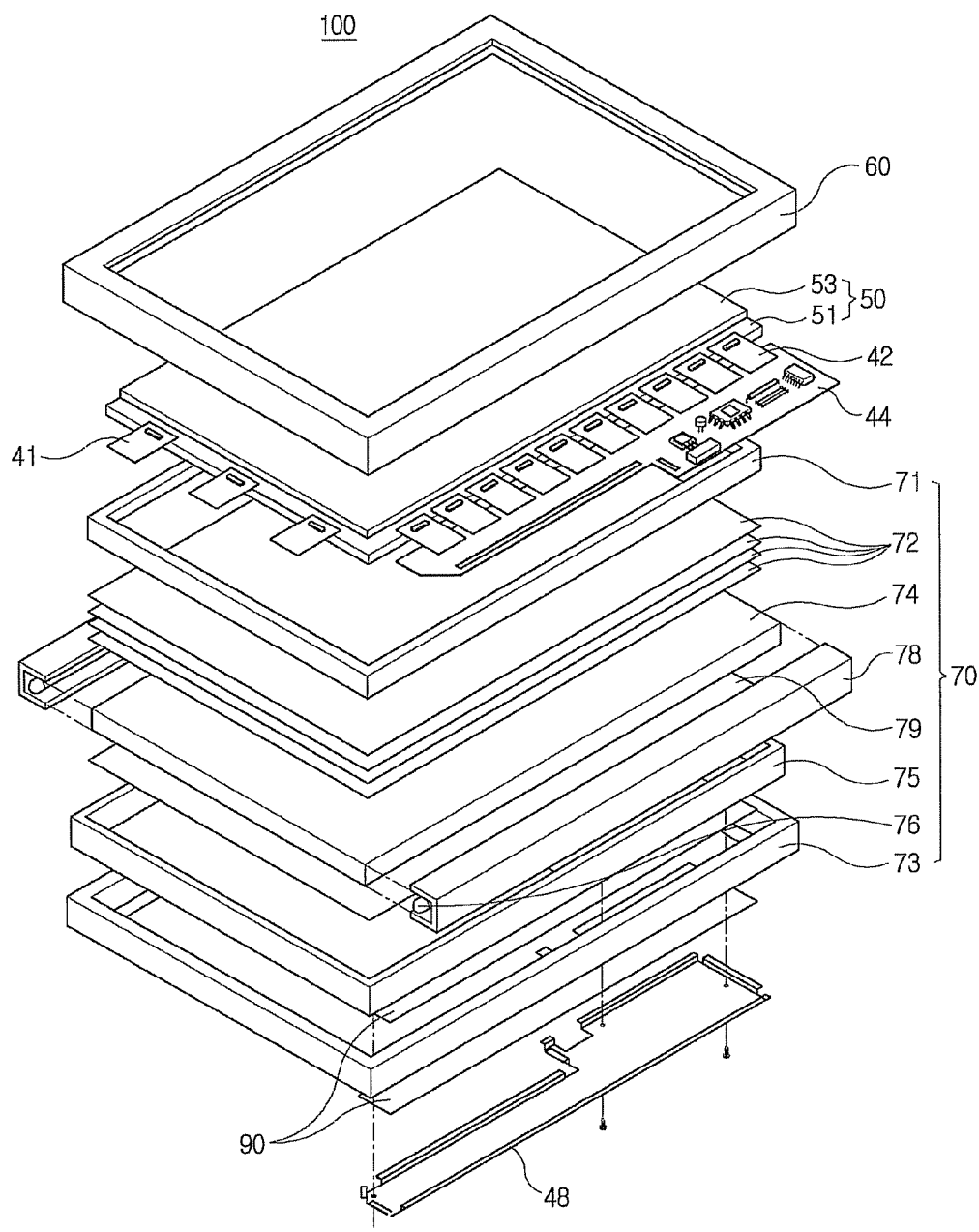
FIG. 1 is an exploded perspective view of an exemplary display device according to a first exemplary embodiment of the present invention.

Reference will now be made in detail to the embodiments of the present invention, examples of which are illustrated in the accompanying drawings, wherein like reference numerals refer to like elements throughout. The embodiments are described below so as to explain the present invention by referring to the figures. These embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

According to the figures, a panel assembly used in a display device is embodied by an LCD panel. However, the panel assembly according to the present invention is not limited to the LCD panel but may alternatively be another type of panel assembly known in the art.

Also, according to the figures, a backlight assembly of an edge-type is used. However, the backlight assembly according to the present invention is not limited to the edge-type backlight assembly but may alternatively be another type of backlight assembly such as, but not limited to, a direct-type backlight assembly and other types of backlight assemblies known in the art.

Also, in describing various exemplary embodiments of the present invention, elements which have the same composition between the exemplary embodiments are referred to by using the same numerals and described representatively in a first exemplary embodiment of the present invention. In the remaining exemplary embodiments other than the first exemplary embodiment, only the elements which are different from those in the first exemplary embodiment are described.

As shown in FIG. 1, the display device 100 according to the first exemplary embodiment of the present invention mainly includes a backlight assembly 70 which supplies light, a panel assembly 50 which receives the light to display an image, and an electromagnetic wave shielding member 90. Also, the display device 100 further includes an attaching member 60 which attaches and supports the panel assembly 50 on the backlight assembly 70, and may further include other parts as necessary.

Also, the display device 100 includes a plurality of driving integrated circuit ("IC") chip packages 41 and 42 which are electrically connected with the panel assembly 50 to transfer driving signals, and a driving PCB 44. The driving IC chip packages 41 and 42 are provided as chip on film packages ("COFs") or tape carrier packages ("TCPs").

The driving IC chip packages 41 and 42 include a gate driving IC chip package 41 and a data driving IC chip package 42. The gate driving IC chip package 41 is attached to an end part of one side of the panel assembly 50 to supply a gate signal to the panel assembly 50. The data driving IC chip package 42 is attached to an end part of another side of the panel assembly 50 to supply a data signal and other signals to the panel assembly 50.

The panel assembly 50 includes a first panel 51 and a second panel 53, which is disposed opposite to the first panel 51, with a liquid crystal layer (not shown) therebetween. In this case, the first panel 51 is a back side substrate and the second panel 53 is a front side substrate. The second panel 53 is smaller than the first panel 51. The driving IC chip packages 41 and 42 are attached to the portion of the first panel 51 which is not overlapped by the second panel 53. At least one of the driving IC chip packages 41 and 42 is also connected with the driving PCB 44.

According to the exemplary embodiment shown in FIG. 1, only data driving IC chip package 42 is connected with the driving PCB 44. However, the present invention is not limited to this exemplary embodiment. In another exemplary embodiment, the gate driving IC chip package 41 may also be connected with another driving PCB (not shown).

The driving PCB 44 generates various control signals and transfers digital-type signals received from an exterior to the driving data IC chip package 42. An IC chip of the data driving IC chip package 42 transforms the digital-type signals into analog-type ones based on various control signals received from the driving PCB 44, and supplies the panel assembly 50 with the analog-type signals to drive the panel assembly 50.

Polarizing plates (not shown) may be attached to a front side of the second panel 53 and a back side of the first panel 51 respectively to linearly polarize a visible light supplied by the backlight assembly 70.

A plurality of thin film transistors ("TFTs"), color filters, pixel electrodes, common electrode, and other elements known in the art are formed on the first panel 51 and the second panel 53. The liquid crystal layer is disposed between the pixel electrodes and the common electrode.

According to a configuration described above, if the TFTs, which are switching devices, are turned on, an electric field is formed between the pixel electrodes and the common electrode. An alignment angle of the liquid crystal in the liquid crystal layer disposed between the first panel 51 and the second panel 53 is changed by such an electric field. Accordingly, a required image is obtained from a varying light transmittance.

Figure 2:
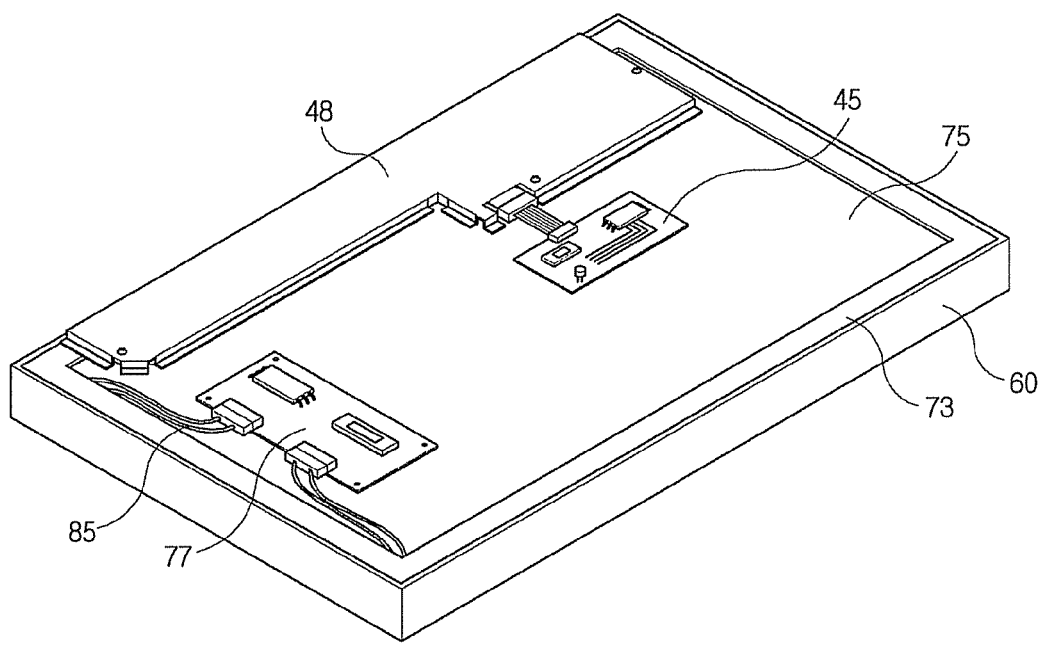
FIG. 2 is a rear side perspective view of the exemplary display device of FIG. 1 in its assembled state.

The backlight assembly 70 includes a light source unit 76 which generates the light, a light source cover 78, optical sheets 72, a light guiding plate 74, a reflecting member 79, a first supporting member 71, a second supporting member 73 and an accommodating member 75. The backlight assembly 70 further includes an inverter circuit board 77 (as shown in FIG. 2) which drives the light source unit 76, and a wire 85 (also shown in FIG. 2) which electrically connects the light source unit 76 with the inverter circuit board 77.

The light guiding plate 74 includes at least one entering surface and an emitting surface which intersects the entering surface. Although not limited thereto, as shown in FIG. 1, the light guiding plate 74 has two entering surfaces. The light guiding plate 74 substantially uniformly spreads the light which has entered through the entering surfaces and emits the spread light through the emitting surface.

The light source unit 76 irradiates the light to the entering surfaces of the light guiding plate 74. The light source unit 76 may include a cold cathode fluorescent lamp ("CCFL"). However, the light source unit 76 according to the present invention is not limited to the CCFL. Alternatively, the light source unit 76 may include an external electrode fluorescent lamp ("EEFL"), a hot cathode fluorescent lamp ("HCFL"), or other light source units known in the art. Also, the light source unit 76 may alternatively include a light emitting device such as a light emitting diode ("LED") and other sources of light known in the art not including a lamp.

The reflecting member 79 faces a lower surface of the light guiding plate 74, which is opposite to the emitting surface. The reflecting member 79 reflects the light which enters the entering surface of the light guiding plate 74 and moves toward the lower surface opposite to the emitting surface. The light reflected by the reflecting member 79 is then emitted through the emitting surface of the light guiding plate 74. Therefore, the reflecting member 79 reduces loss of the light and diffuses the light thus enhancing uniformity of the light emitted from the emitting surface of the light guiding plate 74.

The light source cover 78 surrounds the light source unit 76. The inner surface of the light source cover 78 may include a reflecting material or may be coated by a reflective layer. That is, the light source cover 78 protects the light source unit 76 and reflects the light so that light irradiated by the light source unit 76 moves toward the light guiding plate 74.

The optical sheets 72 enhance brightness of the light emitted from the emitting surface of the light guiding plate 74. That is, the light passing through the optical sheets 72 is spread more uniformly and has an enhanced brightness. The optical sheets 72 may include sheets of various functions. For example, the optical sheets 72 may include a diffusion sheet, a prism sheet, a brightness enhancing sheet, a protection sheet, and other sheets known in the art.

The accommodating member 75 accommodates the light guiding plate 74, the light source unit 76, the light source cover 78, the reflecting member 79, the optical sheets 72 and other elements of the backlight assembly 70 known in the art. The first supporting member 71 is combined with the accommodating member 75 and supports the light guiding plate 74, the light source unit 76, the light source cover 78, the reflecting member 79, the optical sheets 72 and any other elements, all of which are accommodated in the accommodating member 75.

According to FIG. 1, both the accommodating member 75 and the first supporting member 71 are used in the exemplary embodiment. However, the present invention is not limited to having both the accommodating member 75 and the first supporting member 71. In alternative embodiments, the first supporting member 71 may be omitted. In the case where the first supporting member 71 is omitted, the accommodating member 75 also performs the functions of the first supporting member 71.

The second supporting member 73 is combined with the accommodating member 75 along a side surface and an edge part of a back surface of the accommodating member 75. The second supporting member 73 reinforces strength of the accommodating member 75 to prevent the accommodating member 75 from being bent or twisted arbitrarily. That is, the second supporting member 73 protects the accommodating member 75 from deforming. However, in alternative embodiments, the second supporting member 73 may also be omitted in the same manner as the first supporting member 71.

The driving IC chip package 42 is bent, so that the driving PCB 44 is disposed at the back side of the accommodating member 75. The display device 100 further includes a substrate cover 48 which is combined with the accommodating member 75 to cover the driving PCB 44, as shown in FIG. 2.

An electromagnetic wave shielding member 90 is disposed between the back side of the accommodating member 75 and the driving PCB 44. Another electromagnetic wave shielding member 90 is disposed at a surface of the substrate cover 48, which is opposite to the driving PCB 44. In other words, the driving PCB 44 is substantially surrounded by electromagnetic wave shielding members 90, such as by being sandwiched between two electromagnetic wave shielding members 90.

The electromagnetic wave shielding member 90 is integrated with the accommodating member 75 and/or the substrate cover 48, respectively. That is, the electromagnetic wave shielding member 90 and the accommodating member 75 are one body, and/or the electromagnetic wave shielding member 90 and the substrate cover 48 are one body.

As shown in FIG. 2, the inverter circuit board 77 is installed at the back side of the accommodating member 75. The inverter circuit board 77 transforms an electric power from the outside or exterior into an electric power having a predetermined voltage level and applies the transformed electric power to the light source unit 76. The inverter circuit board 77 is electrically connected with the light source unit 76 by the wire 85.

A control circuit board 45 is installed at the back side of the accommodating member 75. The control circuit board 45 is electrically connected with the driving PCB 44, and supplies the driving PCB 44 with the signal or signals which is required to display the image on the panel assembly 50. However, the present invention is not limited to this exemplary embodiment having the control circuit board 45. In an alternative embodiment, the control circuit board 45 may be omitted. In this case, a control circuit may be integrally formed on the driving PCB 44.

According to FIG. 2, the substrate cover 48 covers only the driving PCB 44. However, the present invention is not limited to this exemplary embodiment. In alternative embodiments, an additional substrate cover or covers (not shown) may be further included to cover at least one of the inverter circuit board 77 and the control circuit board 45, respectively.

The electromagnetic wave shielding member 90 may be additionally disposed between the inverter circuit board 77 and the back side of the accommodating member 75 and between the control circuit board 45 and the back side of the accommodating member 75, respectively. In the case that the display device 100 includes additional substrate covers (not shown) which cover the inverter circuit board 77 and the control circuit board 45, the electromagnetic wave shielding member 90 may be additionally disposed at surfaces of the additional substrate covers (not shown), which are opposite to the inverter circuit board 77 and the control circuit board 45, respectively.

That is, the electromagnetic wave shielding member 90 is disposed to surround components which generate the electromagnetic wave, such as the PCBs including the driving PCB 44, the inverter circuit board 77, and the control circuit board 45.

Figure 3:
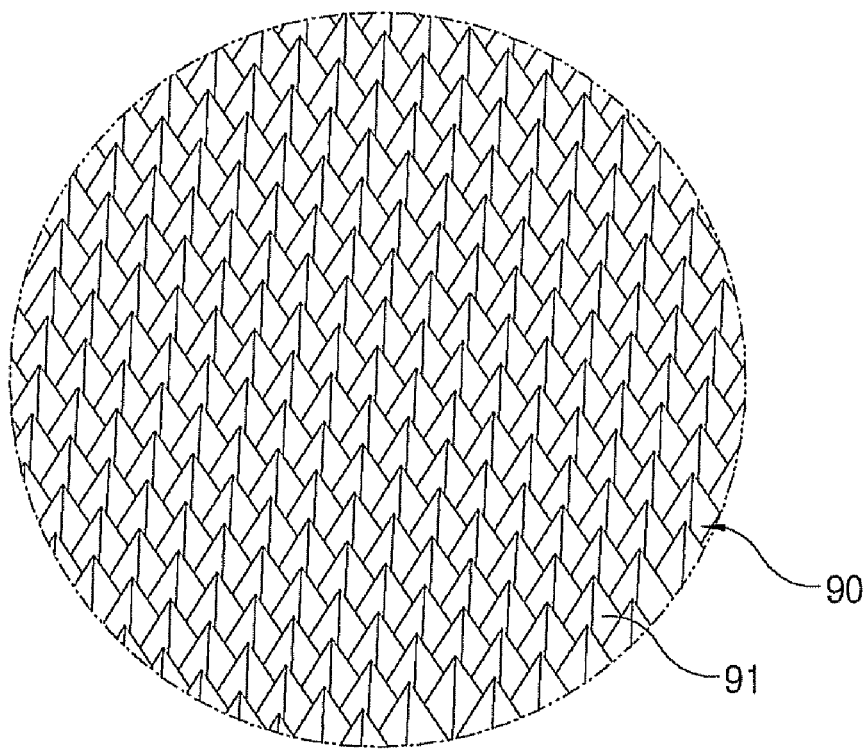
FIG. 3 is an enlarged perspective view of an exemplary protrusion of an exemplary electromagnetic wave shielding member which is used in the exemplary display device of FIG. 1.

FIG. 3 is an enlarged perspective view of a surface of the electromagnetic wave shielding member 90, which faces the driving PCB 44. As described above, an electromagnetic wave shielding member 90 is disposed on the substrate cover 48 facing the driving PCB 44, and another electromagnetic wave shielding member 90 is disposed on the back side of the accommodating member 75 facing the driving PCB 44. As shown in FIG. 3, the electromagnetic wave shielding member 90 includes a plurality of protrusions 91. The protrusions 91 protrude toward the driving PCB 44. The protrusions 91 may be formed to have a shape of a polygonal pyramid, such as a triangular pyramid, a quadrangular pyramid, and other shapes known in the art. That is, the protrusions 91 may have a shape whose vertical section is a triangle.

Also, each protrusion 91 of the electromagnetic wave shielding member 90 has an average width of about 0.1 μm to about 1000 μm. By having the average width of about 0.1 to about 1000 μm, the protrusions 91 can shut or at least substantially reduce the electromagnetic wave of a high frequency band, which would otherwise lower quality of the display device 100 and cause malfunction of the display device 100. If the size of the protrusion 91 is smaller than 0.1 μm or larger than 1000 μm, effect of shielding the electromagnetic wave is decreased. In these exemplary embodiments, the average width is an average value of the various widths that bottom surfaces of the protrusions 91 have. According to the shape of the bottom surface that the protrusion 91 has, the average width may be an average diameter.

The electromagnetic wave shielding member 90 may be formed from a material including one or more materials selected from aloe, wood, metal, and synthetic resins.

In an exemplary embodiment, the electromagnetic wave shielding member 90 may include synthetic resin and have a shape of a film having a plurality of the protrusions 91 at one surface of the film. Alternatively, the electromagnetic wave shielding member 90 may be made by attaching or hardening aloe material. Alternatively, the electromagnetic wave shielding member 90 having a number of the protrusions 91 may be made by fabricating one surface of a plate which is made of wood. Alternatively, the electromagnetic wave shielding member 90 having a number of the protrusions 91 may be made by fabricating a surface of a metal plate which is made of metal using various processing methods.

In an exemplary embodiment, rather than being formed as a separate element, the electromagnetic wave shielding member 90 may be formed integrally with the accommodating member 75 and the substrate cover 48. That is, a plurality of the protrusions 91 may be formed by fabricating surfaces of the accommodating member 75 with the protrusions 91, where at least the driving PCB 44, the inverter circuit board 77 and the control circuit board 45 are installed, so that the accommodating member 75 can perform the same function as the electromagnetic wave shielding member 90. Therefore, the accommodating member 75 itself may perform the functions of the electromagnetic wave shielding member 90. Also, a plurality of the protrusions 91 may be formed by fabricating surfaces of the substrate cover 48 with the protrusions 91, which face the driving PCB 44, the inverter circuit board 77 and the control circuit board 45, so that the substrate cover 48 can perform the same function as the electromagnetic wave shielding member 90. Therefore, the substrate cover 48 itself may perform the functions of the electromagnetic wave shielding member 90.

Figure 4:
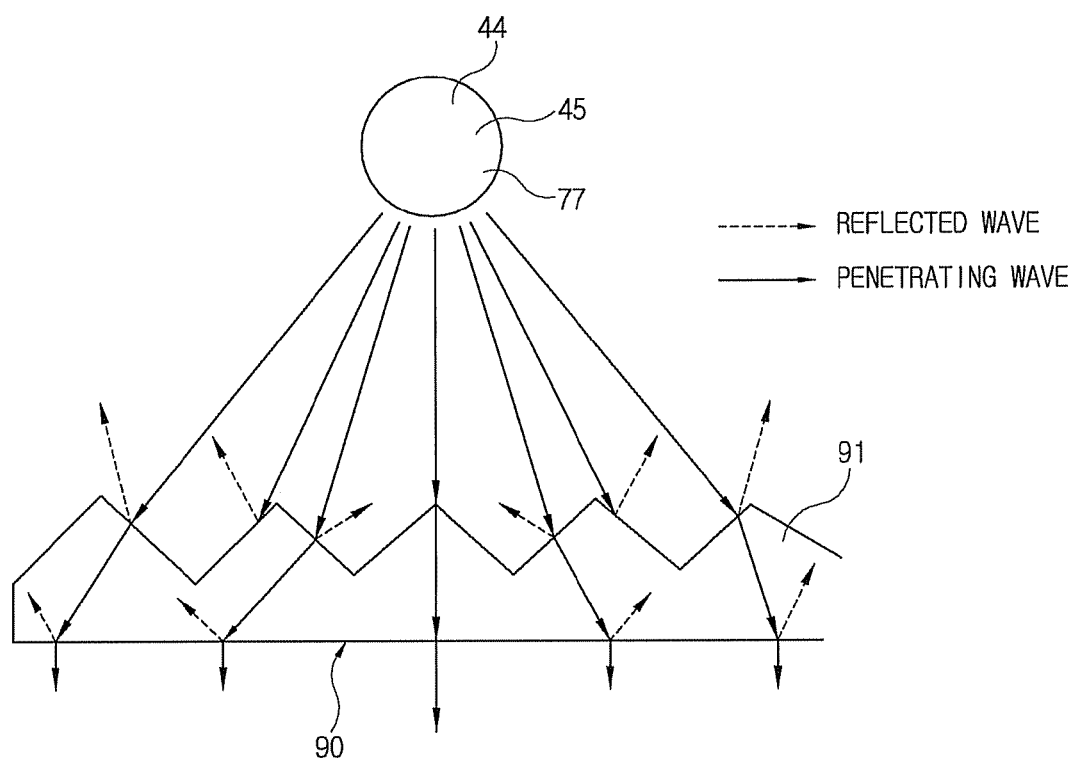
FIG. 4 is a schematic view showing a state where EMI is suppressed by the exemplary electromagnetic wave shielding member of FIG. 1.

As shown in FIG. 4, the electromagnetic wave shielding member 90 reflects electromagnetic wave which is generated by electromagnetic wave generating components such as the driving PCB 44, the inverter circuit board 77 and the control circuit board 45, so that the electromagnetic interference ("EMI") can be prevented from being generated. Therefore, the deterioration in quality and the malfunction of the display device 100 due to the generation of the EMI can be prevented.

In FIG. 4, each arrow with a solid line shows a path in which a part of the electromagnetic wave passes through the electromagnetic wave shielding member 90. On the other hand, the arrow with a dotted line shows a path in which a part of the electromagnetic wave is reflected by the electromagnetic wave shielding member 90. In this way, the electromagnetic wave shielding member 90 reflects at least a substantial portion of the electromagnetic wave to prevent the EMI from being generated.

Figure 5:
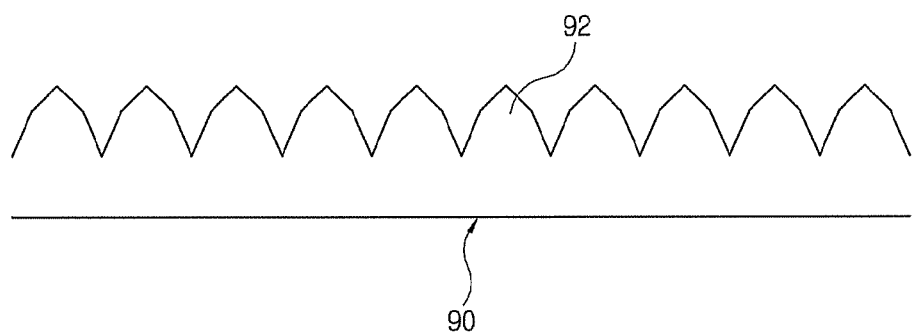
FIG. 5 is a sectional view showing a shape of the exemplary protrusion of the exemplary electromagnetic wave shielding member according to a second exemplary embodiment of the present invention.

FIG. 5 shows a shape of an exemplary protrusion 92 of the exemplary electromagnetic wave shielding member 90 according to a second exemplary embodiment of the present invention. As shown in FIG. 5, a vertical section of the protrusion 92 has a shape of a bulging polygon. The protrusion 92 also has the average width of about 0.1 µm to about 1000 µm. Therefore, the electromagnetic wave shielding member 90 having the protrusion 92 with the above shape can also reflect the electromagnetic wave, or at least a substantial portion of the electromagnetic wave, which is generated by the electromagnetic wave generating components such as the driving PCB 44, the inverter circuit board 77 and the control circuit board 45, so that the EMI can be prevented from being generated.

Figure 6:
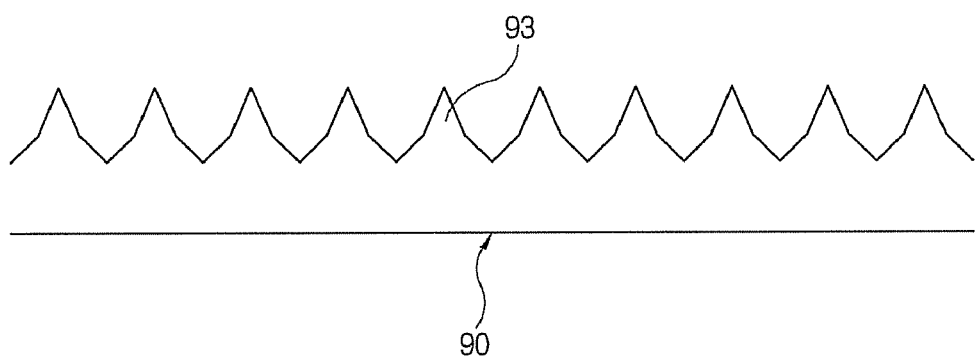
FIG. 6 is a sectional view showing a shape of the exemplary protrusion of the exemplary electromagnetic wave shielding member according to a third exemplary embodiment of the present invention.

FIG. 6 shows a shape of an exemplary protrusion 93 of the exemplary electromagnetic wave shielding member 90 according to a third exemplary embodiment of the present invention. As shown in FIG. 6, a vertical section of the protrusion 93 has a shape of a depressed polygon. The protrusion 93 also has the average width of about 0.1 µm to about 1000 µm. Therefore, the electromagnetic wave shielding member 90 having the protrusion 93 with the above shape can also reflect the electromagnetic wave, or at least a substantial portion of the electromagnetic wave, which is generated by the electromagnetic wave generating components such as the driving PCB 44, the inverter circuit board 77 and the control circuit board 45, so that the EMI can be prevented from being generated.

Figure 7:
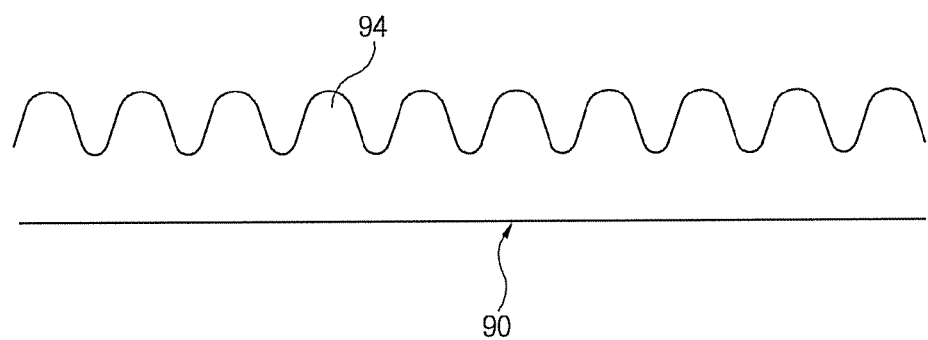
FIG. 7 is a sectional view showing a shape of the exemplary protrusion of the exemplary electromagnetic wave shielding member according to a fourth exemplary embodiment of the present invention.

FIG. 7 shows a shape of an exemplary protrusion 94 of the exemplary electromagnetic wave shielding member 90 according to a fourth exemplary embodiment of the present invention. As shown in FIG. 7, a vertical section of the protrusion 94 has a shape of an arch. The protrusion 94 also has the average width of about 0.1 µm to about 1000 µm. Therefore, the electromagnetic wave shielding member 90 having the protrusion 94 with the above shape can also reflect the electromagnetic wave, or at least a substantial portion of the electromagnetic wave, which is generated by the electromagnetic wave generating components such as the driving PCB 44, the inverter circuit board 77 and the control circuit board 45, so that the EMI can be prevented from being generated.

Figure 8:
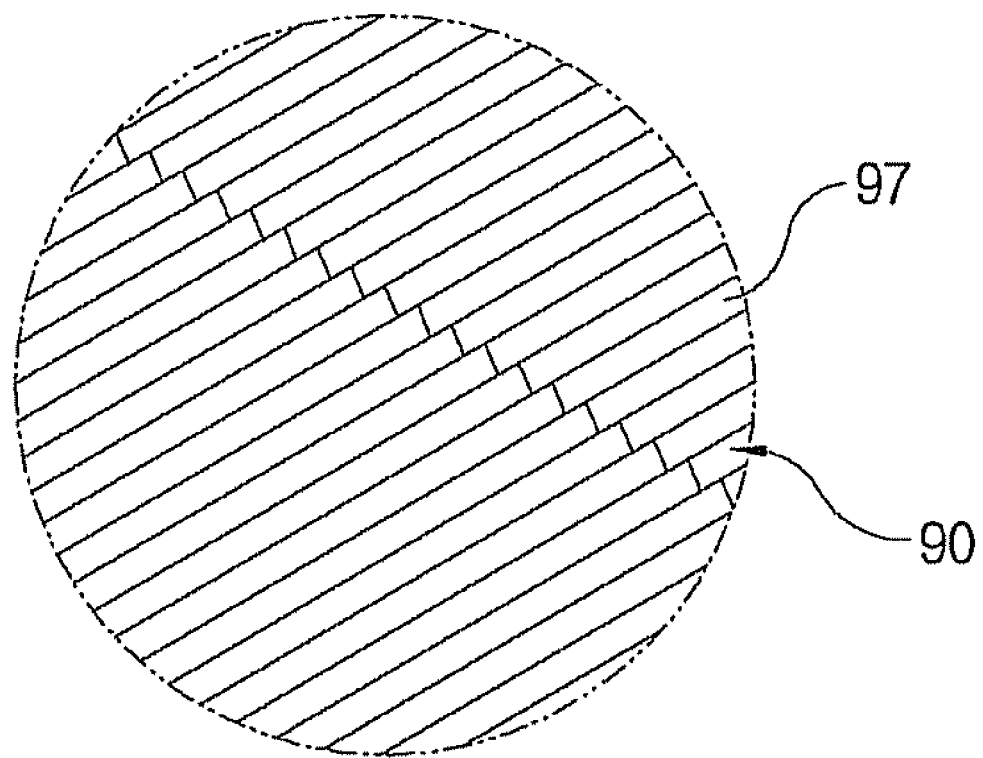
FIG. 8 is an enlarged perspective view of the exemplary protrusion of the exemplary electromagnetic wave shielding member according to a fifth exemplary embodiment of the present invention.

FIG. 8 shows a shape of an exemplary protrusion 97 of the exemplary electromagnetic wave shielding member 90 according to a fifth exemplary embodiment of the present invention. As shown in FIG. 8, the protrusion 97 has a shape of a prism, that is, a laid triangular prism. The protrusion 97 also has an average width of about 0.1 µm to about 1000 µm. Therefore, the electromagnetic wave shielding member 90 having the protrusion 97 with the above shape can also reflect the electromagnetic wave, or at least a substantial portion of the electromagnetic wave, which is generated by the electromagnetic wave generating components such as the driving PCB 44, the inverter circuit board 77 and the control circuit board 45, so that the EMI can be prevented from being generated.

The shape of the section of the prism shaped protrusion 97 is not limited to the triangle, but it may also be the bulging polygon, the depressed polygon or the arch.

Figure 9:
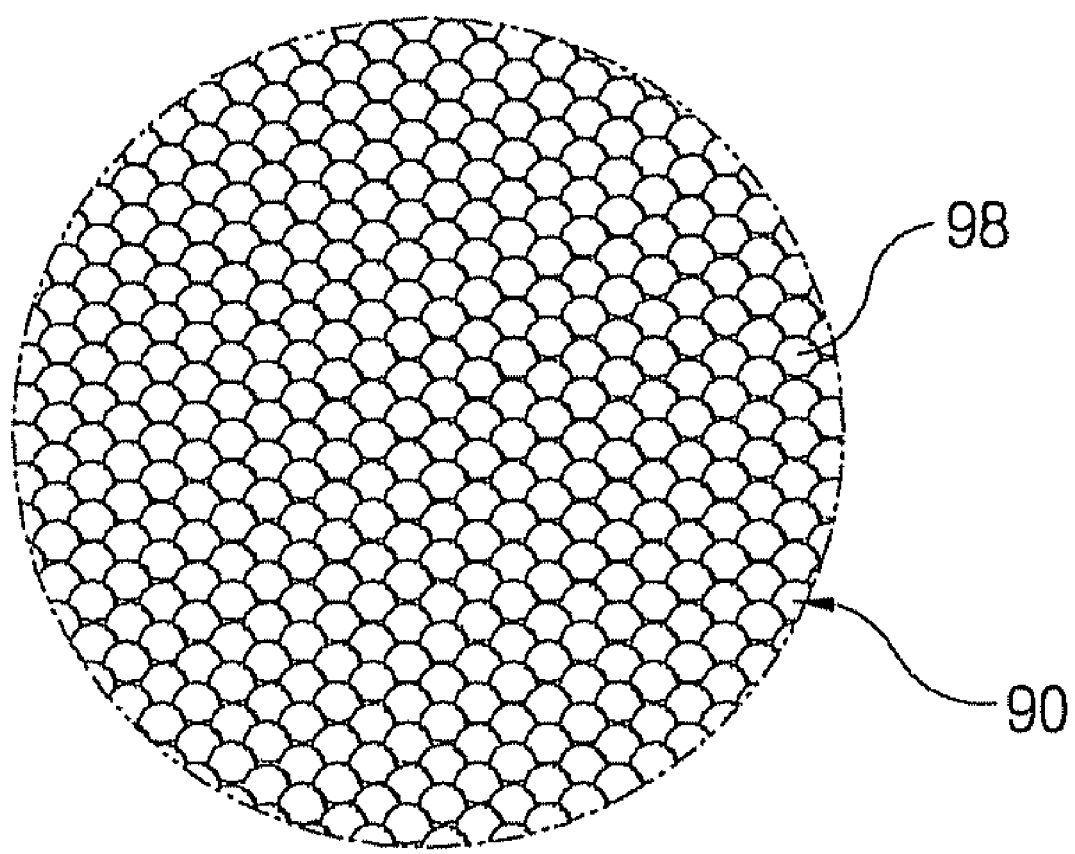
FIG. 9 is an enlarged perspective view of the exemplary protrusion of the exemplary electromagnetic wave shielding member according to a sixth exemplary embodiment of the present invention.

FIG. 9 shows a shape of an exemplary protrusion 98 of the exemplary electromagnetic wave shielding member 90 according to a sixth exemplary embodiment of the present invention. As shown in FIG. 9, the protrusion 98 has a shape of a hemisphere. The protrusion 98 also has the average width, that is diameter, of about 0.1 µm to about 1000 µm. Therefore, the electromagnetic wave shielding member 90 having the protrusion 98 with the above shape can also reflect the electromagnetic wave, or at least a substantial portion of the electromagnetic wave, which is generated by the electromagnetic wave generating components such as the driving PCB 44, the inverter circuit board 77 and the control circuit board 45, so that the EMI can be prevented from being generated.

Hereinafter, the exemplary embodiments of the present invention are described in more detail with an exemplary experiment.

It should be understood that such an exemplary experiment is only referred to for describing an exemplary embodiment of the present invention. Therefore, the present invention is not limited to the exemplary experiment.

Exemplary Experiment

Figure 10:
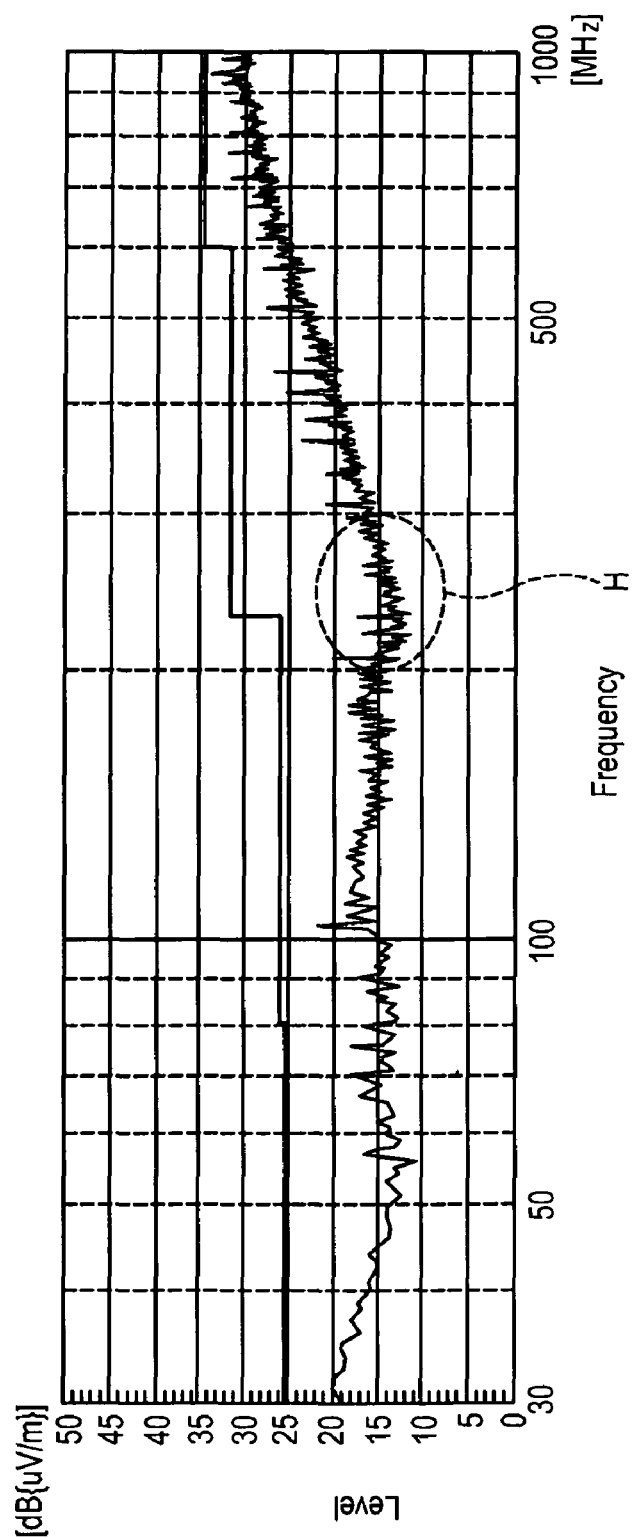
FIG. 10 and FIG. 11 are graphs showing degrees of EMI suppression for an exemplary experiment according to the present invention and for a comparative experiment, respectively.

Degree of the generation of the EMI was estimated with regard to the display device 100 which used the electromagnetic wave shielding member 90 according to the first exemplary embodiment of the present invention. FIG. 10 is a graph showing distribution of the frequency which influences the EMI in the exemplary experiment.

Comparative Experiment

Figure 11:
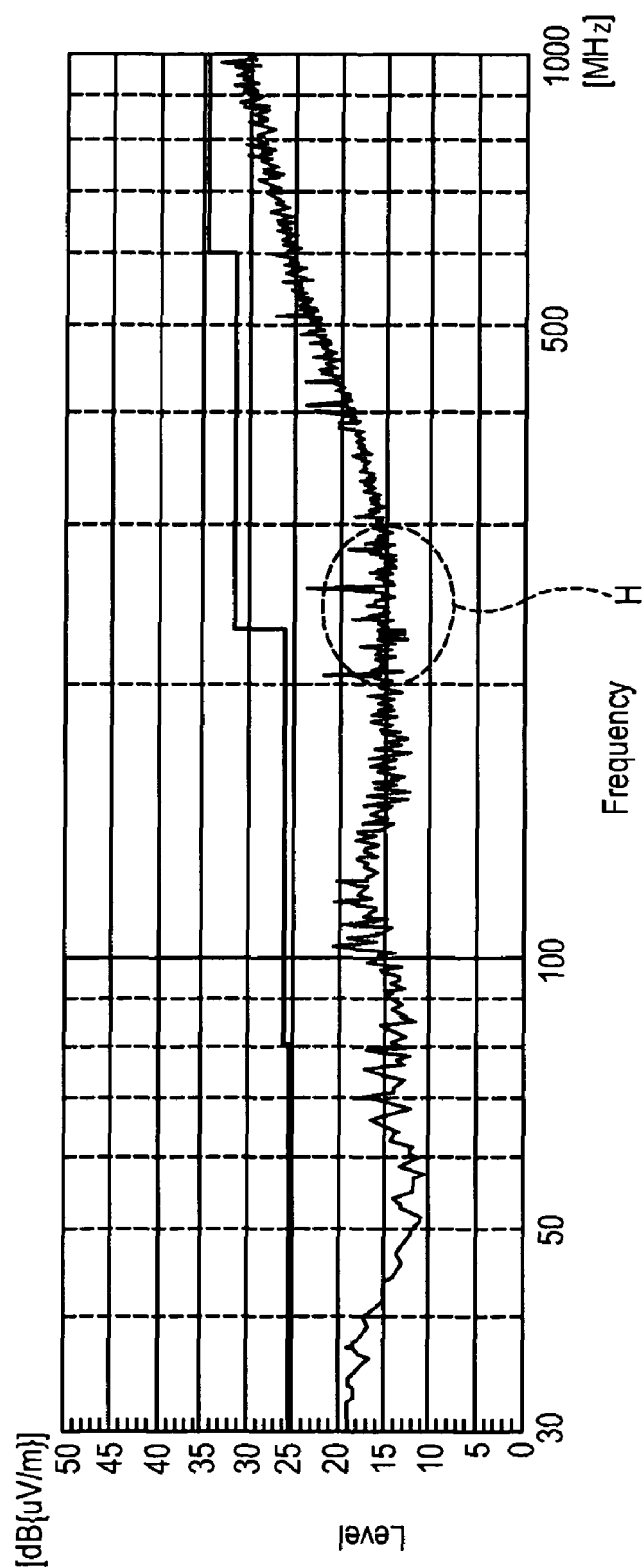

The degree of the generation of the EMI was estimated with regard to a conventional display device which does not use the electromagnetic wave shielding member 90 according to any exemplary embodiment of the present invention. FIG. 11 is a graph showing the distribution of the frequency which influences the EMI in the comparable experiment.

According to the graphs of FIG. 10 and FIG. 11, it can be understood that the frequency, which influences the EMI in the high frequency band where the quality of the display device 100 may be deteriorated or malfunction of the display device 100 may be occurred, is relieved. That is, comparing region R in FIG. 10 with region H in FIG. 11, it can be seen that not only the level in the region R is lower than that in the region H, but also the radically leaping frequency is considerably decreased.

As described above, the display device according to the present invention can decrease the generation of the EMI.

That is, the frequency which influences the EMI can be relieved by surrounding the components, which generate the electromagnetic wave, such as the PCBs including the driving PCB, the inverter circuit board and the control circuit board, with the electromagnetic wave shielding member.

In view of the above described exemplary embodiments of a display device, a method of decreasing generation of electromagnetic interference in the display device, the display device including a display panel disposed in an accommodating member and a PCB disposed on a rear surface of the accommodating member, includes interposing an electromagnetic wave shielding member between the accommodating member and the PCB, the electromagnetic wave shielding member including a plurality of protrusions, where the electromagnetic wave shielding member reflects at least a portion of electromagnetic waves generated by the PCB.

Therefore, the generation of the EMI can be prevented. Also, the quality deterioration of the display device and the malfunction of the display device due to the generation of the EMI can be prevented.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
    a panel assembly which forms an image;
    an accommodating member which accommodates the panel assembly;
    at least one printed circuit board installed on a back side of the accommodating member; and
    an electromagnetic wave shielding member disposed between the accommodating member and the printed circuit board, the electromagnetic wave shielding member comprising a plurality of protrusions.

2. The display device according to claim 1, wherein the printed circuit board further comprises a driving printed circuit board which supplies the panel assembly with a driving signal.

3. The display device according to claim 1, further comprising a light source unit accommodated in the accommodating member and supplying the panel assembly with light, wherein the printed circuit board comprises an inverter circuit board which drives the light source unit.

4. The display device according to claim 1, further comprising a substrate cover combined with the accommodating member and covering the printed circuit board, and an additional electromagnetic wave shielding member disposed on a surface of the substrate cover that faces the printed circuit board.

5. The display device according to claim 4, wherein the electromagnetic wave shielding members are integrally formed with at least one of the accommodating member and the substrate cover, respectively.

6. The display device according to claim 1, wherein the plurality of protrusions have a shape of a polygonal pyramid.

7. The display device according to claim 6, wherein vertical sections of the plurality of protrusions have a shape of an arch.

8. The display device according to claim 1, wherein the plurality of protrusions have a shape of a prism.

9. The display device according to claim 1, wherein the plurality of protrusions have a shape of a hemisphere.

10. The display device according to claim 1, wherein vertical sections of the plurality of protrusions have a shape of a polygon.

11. The display device according to claim 10, wherein the vertical sections of the plurality of protrusions have a shape of a depressed polygon.

12. The display device according to claim 10, wherein the vertical sections of the plurality of protrusions have a shape of a bulging polygon.

13. The display device according to claim 1, wherein the plurality of protrusions have an average width of about 0.1 μm to about 1000 μm.

14. The display device according to claim 1, wherein the electromagnetic wave shielding members comprise at least one of aloe, wood, aluminum, and synthetic resin.

15. A display device comprising:
    a display panel;
    an accommodating member which accommodates the display panel;
    a printed circuit board arranged on a surface of the accommodating member;
    a substrate cover combined with the accommodating member and covering the printed circuit board; and
    an electromagnetic wave shielding member disposed on a surface of the substrate cover that faces the printed circuit board, the electromagnetic wave shielding member comprising a plurality of protrusions.

16. The display device according to claim 15, wherein the plurality of protrusions have an average width of about 0.1 μm to about 1000 μm.

17. The display device according to claim 15, wherein the electromagnetic wave shielding members comprise at least one of aloe, wood, aluminum, and synthetic resin.

18. The display device according to claim 15, further comprising an accommodating member which accommodates the panel assembly, and an additional electromagnetic wave shielding member disposed between the accommodating member and the printed circuit board.

19. A method of decreasing generation of electro-magnetic interference in a display device, the display device including a display panel disposed in an accommodating member and a printed circuit board disposed on a rear surface of the accommodating member, the method comprising:
    interposing an electromagnetic wave shielding member between the accommodating member and the printed circuit board, the electromagnetic wave shielding member including a plurality of protrusions, wherein the electromagnetic wave shielding member reflects at least a portion of electromagnetic waves generated by the printed circuit board.

* * * * *